United States Patent
Tomaru et al.

[11] Patent Number: 6,071,630
[45] Date of Patent: *Jun. 6, 2000

[54] ELECTROSTATIC CHUCK

[75] Inventors: Kazuhiko Tomaru; Ryuichi Handa; Tsutomu Yoneyama, all of Gunma-ken, Japan

[73] Assignee: Shin-Etsu Chemical Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/808,378

[22] Filed: Feb. 28, 1997

[30] Foreign Application Priority Data

Mar. 4, 1996 [JP] Japan ................................ 8-073193
Mar. 19, 1996 [JP] Japan ................................ 8-062325

[51] Int. Cl.⁷ .................... B23B 5/16; B23B 9/06; B23B 9/00; B23B 15/04
[52] U.S. Cl. ..................... 428/627; 428/332; 428/450; 428/469; 428/447; 428/448; 361/234; 279/128
[58] Field of Search ................... 428/332, 450, 428/469, 627, 447, 448; 361/234; 279/128; 269/8, 903

[56] References Cited

U.S. PATENT DOCUMENTS

| | | | |
|---|---|---|---|
| 4,184,188 | 1/1980 | Briglia | 361/234 |
| 4,931,135 | 6/1990 | Horiuchi et al. | 156/643 |
| 5,191,506 | 3/1993 | Logan et al. | 361/234 |
| 5,382,469 | 1/1995 | Kubota et al. | 428/332 |
| 5,413,360 | 5/1995 | Atari et al. | 279/128 |
| 5,645,921 | 7/1997 | Matsunaga et al. | 428/209 |
| 5,646,814 | 7/1997 | Shamouilian et al. | 361/234 |
| 5,753,132 | 5/1998 | Shamouilian et al. | 216/33 |

FOREIGN PATENT DOCUMENTS 59-64245  4/1984  Japan .

OTHER PUBLICATIONS

JIS–A Method (English version) K 6301–1975, pp. 10–15, 1975.

*Primary Examiner*—Paul Thibodeau
*Assistant Examiner*—Holly C. Rickman
*Attorney, Agent, or Firm*—McDermott, Will & Emery

[57] ABSTRACT

An electrostatic chuck comprises a metallic plate, a first insulating layer formed on the metallic plate and composed of a ceramic material, an electrically conductive electrode pattern formed on the first insulating layer, and a second insulating layer formed on the conductive electrode pattern and made of an elastomer. Alternatively, the first and second insulating layers may be each made of a thermally conductive silicone rubber provided that the thermally conductive silicone rubber for the second insulating layer should have a hardness of 85 or below a surface roughness of 5 μm or below.

4 Claims, 2 Drawing Sheets

ELECTROSTATIC CHUCK

BACKGROUND OF THE INVENTION

1. Field of the Invention

This invention relates to an electrostatic chuck which is useful in electrostatically holding a substrate in position in the course of the fabrication of semiconductor integrated circuits and, particularly, in the step of plasma etching.

2. Description of the Prior Art

In the plasma etching step in the manufacture of semiconductor integrated circuits, it is usual to employ a wafer chuck of an electrostatic attachment type or the Jansen-Rerbeck type, or a so-called electrostatic chuck. The chuck essentially includes an insulating layer. As such an insulating layer, there has been proposed the use of plastics such as polyimides, ceramics such as alumina, aluminum nitride and the like, and rubber elastomers such as silicone rubbers. These materials have now been in use.

In the plasma etching step, it is essential that a wafer be uniformly maintained at a given temperature while suppressing the temperature rise of the wafer as will be caused by the heat generated from a plasma, thus ensuring high precision etching. For this purpose, a cooling means for passing a cooling medium in contact with one side of the chuck which is opposite to the wafer side is provided. The wafer can be cooled and uniformly maintained at a given temperature.

With the electrostatic chuck having a ceramic insulating layer, the insulating layer exhibits good durability against a plasma gas and has high thermal conductivity. This type of chuck has now been put into practice. However, the insulating layer which is placed in face-to-face relation with the wafer is so hard that its contact with the wafer is not so intimate. Eventually, the contact heat resistance becomes great, with the attendant problem that a satisfactory heat dissipation or cooling characteristic cannot be expected. In order to solve this problem, the usual practice is to pass an inert gas such as helium between the wafer and the insulating layer, thereby permitting the thermal transfer to smoothly take place between the wafer and the insulating layer through the inert gas. However, the passage of the inert gas requires fine processing of the insulating layer to form grooves in the layer, resulting in the high fabrication cost of the chuck. Moreover, a device for passing the inert gas is necessary, inviting an additional cost.

The electrostatic chuck using a plastic insulating layer such as a polyimide layer is not always satisfactory with respect to the durability against a plasma gas, but is easy in its manufacture and inexpensive. Thus, such a chuck has currently been in wide use. However, the plastic material is low in thermal conductivity and hard, so that like the ceramic electrostatic chuck, the plastic chuck is unlikely to intimately contact with a wafer. Because of the great contact heat resistance, a good cooling characteristic cannot be expected as well.

Japanese Laid-open Patent 59-64245 proposes an electrostatic chuck using a silicon rubber insulating layer. More particularly, the electrostatic chuck includes a metallic plate, a first insulating film composed of a heat-dissipating silicone prepreg impregnated in a glass cloth, a copper pattern formed on the first insulating film and serving as electrodes, and a second insulating film formed on the copper pattern and composed of a silicone rubber. Since the second insulating layer consists of the elastic silicone rubber, the contact heat resistance is relatively small. Thus, the layer exhibits a good heat-dissipating characteristic. A wafer which is brought into contact with the second insulating layer can be readily, uniformly maintained at a given temperature in an efficient manner.

In recent years, however, there is a demand for an electrostatic chuck which has the capability of cooling a wafer which is heated to a higher temperature. The electrostatic chuck having such a structure as set out in the above-indicated Japanese Laid-open Patent Application No. 59-64245 is insufficient to meet the above demand, i.e. the cooling capability of the chuck has been found to be unsatisfactory.

SUMMARY OF THE INVENTION

It is accordingly an object of the invention to provide an electrostatic chuck which is improved over the known counterparts and which has good durability against a plasma gas, ensures good contact with a wafer, and has good thermal conductivity.

It is another object of the invention to provide an electrostatic chuck which is particularly suitable for holding a substrate or wafer in position in the course of the manufacture of semiconductor integrated circuits and has good capability of cooling the wafer on contact with a cooling medium.

According to one embodiment of the invention, there is provided an electrostatic chuck which comprises a metallic plate, a first insulating layer formed on the metallic plate and composed of a ceramic material, an electrically conductive electrode pattern formed on the first insulating layer, and a second insulating layer formed on the conductive pattern and made of an elastomer composition.

According to another embodiment of the invention, there is also provided an electrostatic chuck which comprises a metallic plate, a first insulating layer formed on the metallic plate and composed of a thermally conductive silicone rubber composition, an electrically conductive electrode pattern formed on the first insulating layer, and a second insulating layer formed on the conductive pattern and made of a thermally conductive silicone rubber composition having a hardness of 85 or below wherein the second insulating layer has a surface roughness of 5 $\mu$m or below.

In both embodiments, the conductive pattern may be of the monopolar type wherein the pattern serves as an electrode, or of the bipolar type wherein the pattern is formed into two separate electrode portions or halves serving as a pair of electrodes.

PREFERRED EMBODIMENTS OF THE INVENTION

Figure 1:
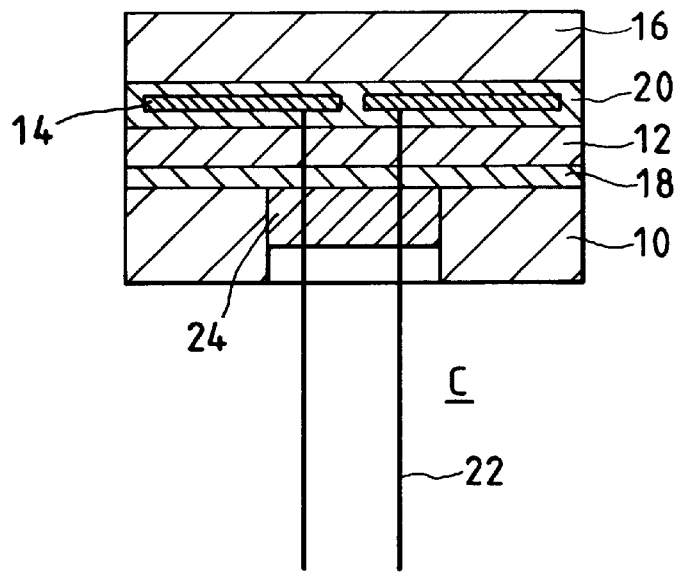
FIG. 1 is a schematic sectional view showing an electrostatic chuck according to one embodiment of the invention.
Figure 2:
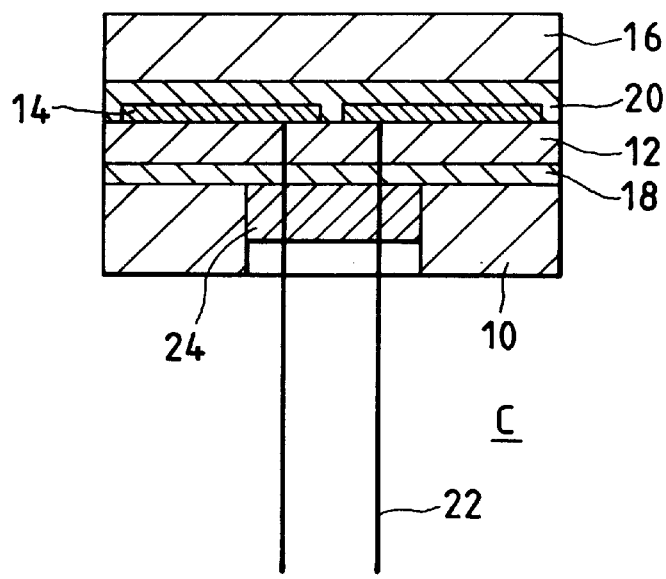
FIG. 2 is a schematic sectional view showing an electrostatic chuck according to another embodiment of the invention.

Reference is now made to the accompanying drawings and particularly, to FIGS. 1 and 2, in which like reference numerals indicate like parts or members. FIGS. 1 and 2 show a bipolar electrostatic chuck generally indicated by C. The chuck C includes a metallic plate 10, on which a first insulating layer 12, a conductive pattern 14 and a second insulating layer 16 are formed in this order. The first insulating layer 12, the conductive pattern 14 and the second insulating layer 16 may be directly formed on the metallic plate 10. It is preferred to use an adhesive or primer to bond, for example, the metallic plate 10 and the first insulating layer 12 through an adhesive or primer layer 18, the first insulating layer 12 and the conductive pattern 14 through an adhesive or primer layer 20, and also the conductive pattern 14 and the second insulating layer 16 through the adhesive or primer layer 20 as is particularly shown in FIG. 1.

In FIG. 2, the conductive pattern 14 is directly formed on the first insulating layer 12 while fixing the conductive pattern 14 with the adhesive layer 20 applied thereover.

Lead wires 22 are each connected to separate electrode halves or portions of the conductive pattern serving as a pair of electrodes. Reference numeral 24 indicates a sealant.

In operation, when a potential is applied between the lead wires 22, whereupon a wafer (not shown) mounted on the second insulating layer 16 is electrostatically attracted toward the layer 16 to fixedly secure the wafer thereon.

In accordance with one embodiment of the invention, the metallic plate 10 which serves as an electrode of a high frequency power supply for generating a plasma should be durable against a plasma gas and should not contaminate a semiconductor integrated circuit formed on the wafer owing to the generation of dust from the metallic plate 10. The materials for the metallic plate 10 include, for example, aluminum, alumite, duralmin and the like.

The first insulating layer 12 is made of a ceramic material. In order to enhance the thermal conductivity of the resultant electrostatic chuck, the ceramics should preferably be high in thermal conductivity. More particularly, the thermal conductivity should preferably be not less than 0.05 cal/cm·second·° C. Examples of such ceramics include aluminum nitride, alumina, boron nitride and silicon nitride, used singly or in combination. If the thermal conductivity of the ceramics is 0.05 cal/cm·second·° C. or greater, the wafer mounted on the chuck can be uniformly maintained at a given temperature while suppressing the temperature rise by the heat emitted from a plasma. This ensures high precision etching. However, if the thermal conductivity is less than 0.05 cal/cm·second·° C., the cooling efficiency for the wafer lowers. More particularly, the temperature of the wafer increases, making it almost impossible to appropriately control the temperature at a constant level. This results in a poor yield of integrated circuits.

The ceramic layer should preferably have a thickness of 100 to 2000 μm. If the thickness is smaller than 100 μm, the dielectric strength becomes small, with the high possibility that the resultant electrostatic chuck suffers dielectric breakdown. This is disadvantageous from the standpoint of the yield of semiconductor devices. On the other hand, when the thickness exceeds 2000 μm, the capability of heat dissipation lowers. Thus, the cooling efficiency of a wafer, in turn, lowers, thus leading to a poor yield of semiconductor devices.

The conductive electrode pattern 14 serves to electrostatically attract a wafer toward the chuck C.

The conductive electrode pattern 14 is made of a metallic conductor such as copper, aluminum, nickel, silver, tungsten or the like, or a ceramic conductor such as titanium nitride. This pattern should preferably have a thickness of 1 to 100 μm, more preferably from 5 to 50 μm. If the thickness is less than 1 μm, the pattern is short of mechanical strength. This may lead to the problem that when the second insulating layer is built up or when the lead wires through which electric power is supplied are bonded to the pattern with a solder by use of a solder iron, the pattern is very likely to break. On the contrary, when the thickness exceeds 100 μm, the pattern is saturated with respect to mechanical strength and electric properties, and no further improvement can be expected, thus being poor in economy.

The conductive pattern 14 may be in any known form. Broadly, the pattern is classified into a monopolar type and a bipolar type. With the monopolar type, the pattern generally serves as a positive electrode. With the bipolar type, the pattern consists of two halves or portions serving as positive and negative electrodes to which a potential is applied. A typical bipolar conductive pattern is particularly shown in FIG. 3. In the figure, the pattern 14 consists of two halves 26 separated and kept away from each other at a given distance. This type of pattern is shown in FIGS. 1 and 2. The monopolar or bipolar type is well known in the art and is not further described herein.

The second insulating layer should be made of an elastomer composition of high thermal conductivity which comprises an elastomer and a filler. The thermal conductivity should preferably be not less than 0.0005 cal/cm·second·° C., more preferably not less than 0.001 cal/cm·second·° C. When the thermal conductivity is not less than 0.0005 cal/cm·second·° C., the temperature of a wafer can be maintained at a uniform and constant level while suppressing the temperature rise of the wafer caused by application of heat generated from a plasma. Thus, the plasma etching can be performed in high accuracy. However, if the thermal conductivity is less than 0.0005 cal/cm·second·° C., the cooling efficiency for the wafer lowers. The wafer increases in temperature and cannot be maintained at a constant temperature level. Thus, the yield of the resultant integrated circuits lowers.

It will be noted that although a higher thermal conductivity is better, the thermal conductivity depends greatly on the content of a filler in the elastomer composition. In this connection, however, a greater amount of a filler results in a higher hardness of the resultant elastomer. If the hardness exceeds 90° when determined by a method described in JIS A, there arises the problem that the elastomer layer exhibits relatively poor adherence to or contact with a wafer. In this sense, it is difficult to impart, to the elastomer layer, a thermal conductivity which is 0.05 cal/cm·second·° C. or greater.

The fillers for imparting high thermal conductivity to the elastomer composition includes ceramic powders of high thermal conductivity such as alumina powder, aluminum nitride powder, boron nitride powder, silicon nitride powder, magnesium oxide powder, silica powder and the like. The amount of the filler in the composition should be sufficient to impart a thermal conductivity of not less than 0.0005 cal/cm·second·° C. to the elastomer composition. The filler may be mixed with an elastomer by any known procedures. The powders should preferably be present in amounts of 20 to 90 wt %, more preferably 30 to 85 wt %, based on the silicone composition although depending on the type of filler.

It is important that the second insulating layer permit intimate contact with a wafer so as to lower the contact heat resistance. To this end, it is required that when a wafer is electrostatically attracted against the chuck, the second insulating layer be so deformed in the surface thereof as to follow up the shape of the contact side of the wafer. To meet this requirement, the hardness of the elastomer composition should preferably be within a range of 30 to 90°, more preferably from 40 to 85° and most preferably 50 to 80° when determined according to the method mentioned above. If the hardness is smaller than 30°, the adherence between the second insulating layer and the wafer becomes high. This may lead to the problem that when the wafer is separated from the chuck after completion of the plasma etching, the easy separation of the wafer becomes difficult owing to the high adherence. In contrast, when the hardness exceeds 90°, the second insulating layer is unlikely to deform when an electrostatic attraction force is exerted thereon through a wafer, thus lowering the capability of following-up the shape of the wafer being contacted. This undesirably results in a great contact heat resistance.

Examples of the elastomer used in the composition for the second insulating layer include silicone rubbers, ethylene-propylene-dienomethylene rubber (EPDM), fluorine rubbers, nitrile rubbers, natural rubber and the like. It is preferred to use a cured product of a silicone rubber composition. This is because such a cured product contains only reduced amounts of impurities and outgas components and is thus favorable for use in the process of fabricating semiconductor integrated circuits.

The silicone rubber composition may be either of the millable solid type or the liquid type prior to curing. The curing may be effected by any know procedures including curing with peroxides, curing through addition reactions, curing by condensation, or UV curing.

The thickness of the second insulating layer should preferably be as thin as possible from the standpoint of heat dissipation and is preferably in the range of 50 to 1000 $\mu$m. If the thickness is smaller than 50 $\mu$m, the dielectric strength lowers, with the high possibility that the electrostatic chuck suffers dielectric breakdown. This is inconvenient in lowering the yield of semiconductor devices. On the other hand, when the thickness exceeds 1000 $\mu$m, the heat dissipating characteristic lowers with a poor cooling efficiency of a wafer. Thus, the yield of integrated circuits undesirably lowers.

The flatness and surface roughness of the second insulating layer influence the adherence to a wafer and also the contact heat resistance between the wafer and the second insulating layer. The flatness should preferably be not greater than 50 $\mu$m in order to ensure good contact with or adherence to the wafer. If the flatness exceeds 50 $\mu$m, the adherence to the wafer lowers, resulting in the lowering of the heat dissipating or cooling property. The wafer cannot be cooled in a high efficiency, with the attendant problem that the yield of integrated circuits being processes lowers.

The surface roughness, Ra, of the layer should preferably be smaller than 10 $\mu$m, more preferably 5 $\mu$m or below, in order to ensure good contact with the wafer. If the surface roughness exceeds 10 $\mu$m, the cooling characteristic lowers and the wafer cannot be cooled efficiently. Thus, the yield of integrated circuits lowers.

Since the cured product of the elastomer composition is in direct contact with a wafer, the content of conductive impurities, if present, in the product should be as small as possible. More particularly, the content of alkali metals, alkaline earth metals, and heavy metals such as iron, nickel, copper, chromium and the like should preferably be contained in amounts of 1 ppm or below so that these impurity components are unlikely to be migrated to the wafer.

For the purpose of appropriately controlling the strength and hardness of the cured product of an elastomer composition, various types of known additives may be added to the composition including, for example, fillers, colorants, flame retardants and the like.

The respective layers and pattern of the electrostatic chuck of the invention may be built up by adhesion or through mere superimposition by intimate contact. It is preferred to use primers or adhesives as shown in FIGS. 1 and 2. Such adhesives include, for example, known silicone rubber adhesives, acrylic adhesives and the like as will be particularly set out in examples. Examples of the primers include those primers containing silane coupling agents, titanium coupling agents and the like. In order to prevent the lowering of the thermal conductivity, the amount of the adhesives or primers should preferably be small. If used, the thickness of the adhesive or primer layer should preferably be in the range of 0.1 to 30 $\mu$m.

The conductive pattern may be formed on the first insulating layer by printing of a conductive paste, plating, or bonding of a conductive metal film or films.

The lead wires are used for connection between the conductive pattern and an electric supply for application of a voltage to the pattern. Usually, a voltage of up to ±4000 V is applied to the lead wires. The lead wire should preferably be a fluorine resin-sheathed wire having a good dielectric strength. Examples of such fluorine resins include polyfluorotetraethylene (PTFE), fluorinated ethylene-propylene copolymers (FEP), PFA and the like. The lead wires are electrically connected to the conductive pattern such as by soldering.

The electric insulation between the lead wires and also between the respective wires and the metallic substrate is performed using silicone sealants, epoxy sealants, polyimide sealants and the like sealants ordinarily used for this purpose.

An electrostatic chuck according to another embodiment of the invention is described. The chuck of this embodiment has substantially the same structural arrangement as those illustrated with reference to FIGS. 1 and 2 showing the first embodiment of the invention except that the first insulating layer is made of a thermally conductive silicone rubber and the second insulating layer is made of a thermally conductive silicone rubber with a hardness of 85 or below and a surface roughness of 5 $\mu$m or below.

Since the metallic substrate and the conductive pattern along with other adhesive layers, sealants and lead wires are substantially the same as those of the first embodiment, the first and second insulating layers alone are described in detail.

The first insulating layer 12 and the second insulating layer 16 of this embodiment as shown in FIGS. 1 and 2 are, respectively, made of a thermally conductive silicone rubber. In both cases, the thermal conductivity should preferably be not less than 0.0005 cal/cm·second·° C., more preferably not less than 0.0008 cal/cm·second·° C., and most preferably not less than 0.001 cal/cm·second·° C. If the thermal conductivity is too low, the temperature of a wafer cannot be maintained uniform and constant while suppressing the temperature rise of the wafer caused by the heat generated from a plasma. Accordingly, high precision etching cannot be expected.

The thermal conductive silicone rubber used as the first insulating layer 12 is not critical with respect to the hardness thereof.

On the other hand, the thermal conductive silicone rubber used as the second insulating layer 16 should have a hardness of 85 or below, preferably 50 to 80 when determined according to the method described in JIS A. Moreover, the second insulating layer should have a surface roughness, Ra, of 5 μm or below, preferably 2 μm or below.

If the hardness exceeds 85 or if the surface roughness exceeds 5 μm, the intimate contact with a wafer may not be ensured, resulting in a great contact heat resistance. Thus, it is not possible to maintain the wafer temperature at an accurately controlled, uniform and constant level.

The thermally conductive silicone rubber for both insulating layers should preferably consist of a cured product of a composition which comprises organopolysiloxane and a thermal conductive powder such as of alumina, silicon nitride, aluminum nitride, boron nitride, magnesium oxide, quartz or the like. Although depending on the type of powder and the intended hardness of both layers, particularly the second layer, the content of the conductive powder is preferably 20 to about 90 wt %, more preferably 30 to 80 wt %. Reinforcing fillers such as silica, colorants, and flame retardants may be further formulated, if desired. The thermal conductive silicone rubber which is in direct contact with a wafer should favorably be reduced in amounts of conductive impurities. More particularly, the content of alkali metals, alkaline earth metals, and heavy metals such as iron, nickel, copper, chromium and the like should preferably be 1 ppm or below.

Like the first embodiment, the composition prior to curing may be of the millable solid type or the liquid type. The manner of curing the composition is not critical, and the composition may be cured with peroxides, through addition reaction or condensation, by irradiation of UV light or like. In view of the working properties and the moldability, the curing with peroxides or through addition reaction is preferred. More preferably, a millable type composition is used and cured with peroxides or through addition reaction.

The first and second insulating layers should, respectively, have a thickness of 50 to 100 μm. If the thickness is smaller than 50 μm, the dielectric strength lowers, with the possibility that the dielectric breakdown takes place. On the other hand, when the thickness exceeds 1000 μm, the cooling properties undesirably lower.

As in the first embodiment, the metallic substrate, the first and second insulating layers, and the conductive pattern may be fixed by intimate contact alone, and should preferably be bonded together through a primer or an adhesive. The primers or adhesives may be those defined hereinbefore. In order not to lower the thermal conductivity by application of a primer or adhesive, the amount of the primer or adhesive should preferably be as small as possible. The thickness of the primer or adhesive layer should preferably be in the range of 0.1 to 30 μm.

The electrostatic chucks according to both embodiments of the invention exhibit good cooling or heat-dissipating properties and ensure good contact with a wafer. Accordingly, when used for the fabrication of semiconductor integrated circuits, the chuck is able to maintain a wafer or substrate in position. Especially, when used in a plasma etching process, the chuck is effective in keeping the temperature of a wafer accurately, uniformly and constantly, ensuring high precision etching.

The present invention is more particularly described by way of examples, which should not be construed as limiting the invention thereto. Comparative Examples are also shown.

COMPOSITIONAL EXAMPLES 1 TO 4

Silicone rubber compositions, respectively, having formulations 1 to 4 which contained starting materials selected from A to F shown in Table 1 were compounded with rolls and each subjected to press molding under conditions of a press pressure of 5 kg/cm$^2$, a temperature of 170° C. and a time of 30 minutes to obtain a sheet. The resultant silicone rubber sheet was used to make an electrostatic chuck having an arrangement shown in Table 2.

TABLE 1

|  | Compositional Example 1 | Compositional Example 2 | Compositional Example 3 | Compositional Example 4 |
|---|---|---|---|---|
| Starting Materials (parts by weight): |  |  |  |  |
| A | 100 | 100 | 100 | 100 |
| B | 3 | 3 | 3 | 3 |
| C | 350 | 0 | 0 | 0 |
| D | 0 | 250 | 0 | 0 |
| E | 0 | 0 | 400 | 0 |
| F | 0 | 0 | 0 | 150 |
| Hardness of Cured Product JIS-A (°) | 75 | 65 | 80 | 50 |
| Surface Roughness, Ra, (μm) | 0.5 | 0.8 | 1.1 | 0.5 |
| Thermal Conductivity (cal/cm · second · ° C.) | 0.0011 | 0.0026 | 0.0038 | 0.0008 |
| Sheet Thickness (μm) | 250 | 250 | 250 | 250 |

A: Methylvinylpolysiloxane consisting of 99.85 mole % of dimethylsiloxane units and 0.15 mole % of methylvinylsiloxane units and having an average degree of polymerization of 8000.
B: Di-t-butyl peroxide
C: Alumina powder (Al 24, commercial name of Showa Denko K. K.)
D: Aluminum nitride (XUS-35548, commercial name of Dow Chemical Co.)
E: Born nitride powder (KBN (h) 10, commercial name of Shin-Etsu Chemical Co., Ltd.)
F: Silica powder (Crystallite, commercial name of Takimori Co., Ltd.)

EXAMPLE 1

Electrostatic chucks having such an arrangement shown in Table 2 were, respectively, made. More particularly, a first insulating sheet made of alumina was plated with copper to form a bipolar electrode pattern having a thickness of 20 μm and shown in FIG. 3. Thereafter, the silicone rubber sheet of Compositional Example 1 serving as a second insulating layer was screen printed with a silicone adhesive KE1801 (commercially available from Shin-Etsu Chemical Co., Ltd.) in a thickness of 25 μm and bonded with the alumina sheet at the side of the copper pattern, followed by press bonding under conditions of a compression pressure of 0.1 kgf/cm$^2$, a temperature of 120° C. and a time of 10 minutes.

An aluminum substrate was separately provided and coated with a silicone adhesive KE1801 in a thickness of 10 μm and bonded with the alumina sheet of the composite sheet composed of the alumina sheet/copper pattern/the silicone rubber sheet of Compositional Example 1, followed by press bonding under conditions of a compression pressure of 0.01 kgf/cm$^2$, a temperature of 120° C. and a time of 10 minutes. Two lead wires were bonded to the copper pattern by soldering. In order to electrically insulate the lead wires therebetween and also between the aluminum substrate and the two lead wires, a silicone potting agent KJR 632 (commercially available from Shin-Etsu Chemical Co., Ltd.) was applied as shown in FIG. 2, thereby obtaining an electrostatic chuck of the type shown in FIG. 2.

TABLE 2

|  | Example 1 | Example 2 | Example 3 | Example 4 |
| --- | --- | --- | --- | --- |
| Second insulating layer | Compositional Example 1 | Compositional Example 2 | Compositional Example 3 | Compositional Example 4 |
| Interfacial adhesive between second insulating layer and conductive pattern | KE 1801 curable through addition reaction | KE 44 curable through condensation | KE 1801 curable through addition reaction | KE 1825 curable through addition reaction |
| Conductive pattern | copper | silver | tungsten | copper |
| Thickness | 20 μm | 10 μm | 15 μm | 35 μm |
| Interfacial adhesive between first insulating layer and conductive pattern | (direct formation by silver plating) | (baking after printing of a silver paste) | (baking after printing of a tungsten paste) | KE 1825 curable through addition reaction |
| First insulating layer | alumina | aluminum nitride | boron nitride | quartz |
| Thickness | 500 μm | 400 μm | 300 μm | 200 μm |
| Interfacial adhesive between first insulating layer and metallic substrate | KE 1801 curable through addition reaction | KE 44 curable through condensation | KE 1801 curable through addition reaction | KE 1825 curable through addition reaction |
| Metallic substrate | aluminum | aluminum | duralmin | duralmin |
| Surface temperature of wafer (° C.) | 50 | 30 | 40 | 65 |

Note: All the interfacial adhesives are commercially available from Shin-Etsu Chemical Co., Ltd.

Figure 4:
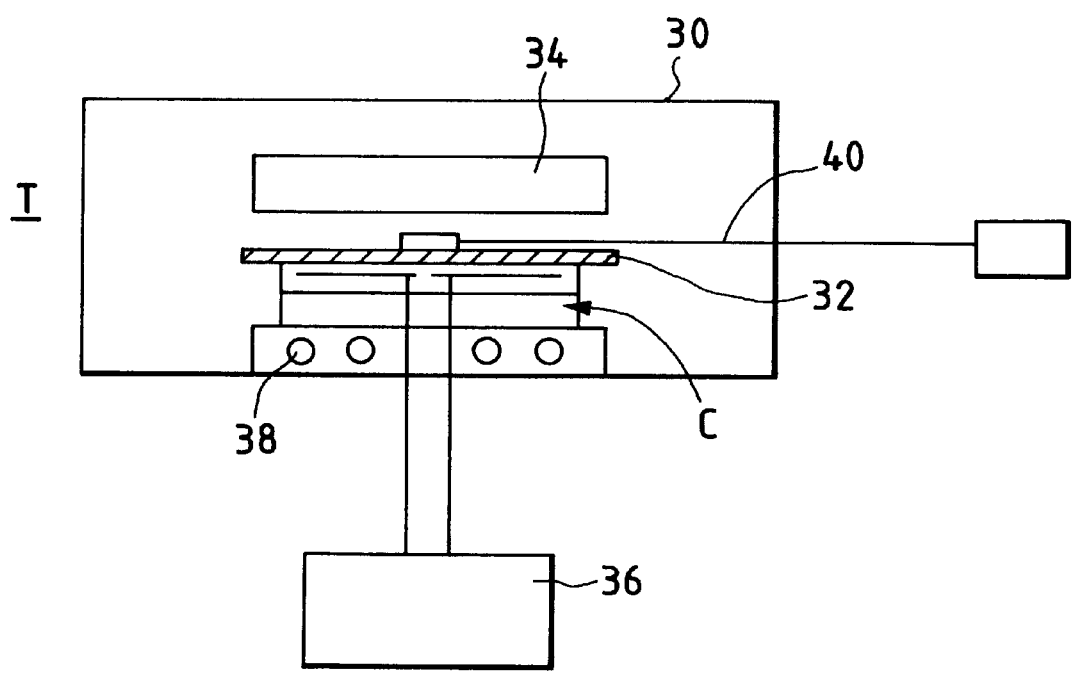
FIG. 4 is a schematic side view of a tester for an electrostatic chuck to evaluate a cooling performance thereof.

Each electrostatic chuck C was set in a cooling performance tester T shown in FIG. 4 to evaluate a cooling performance of the chuck. The test was conducted in the following manner. The chuck was placed in a chamber 30 of the tester T at a reduced pressure of 0.01 Torr., to which a direct voltage of +0.5 kV was supplied from a power supply 36. As a result, a wafer 32 was electrostatically fixed on the chuck C. The wafer 32 was heated up to 150° C. by means of a heater 34. Cooling water 36 was circulated at 4° C. The temperature of the wafer 32 which was equilibrated was measured by use of a surface thermometer 40. The results are shown in Table 2, revealing that the equilibrated wafer temperature was found to be 50° C. Thus, it was confirmed that the electrostatic chuck exhibited a good cooling performance.

EXAMPLE 2

Figure 3:
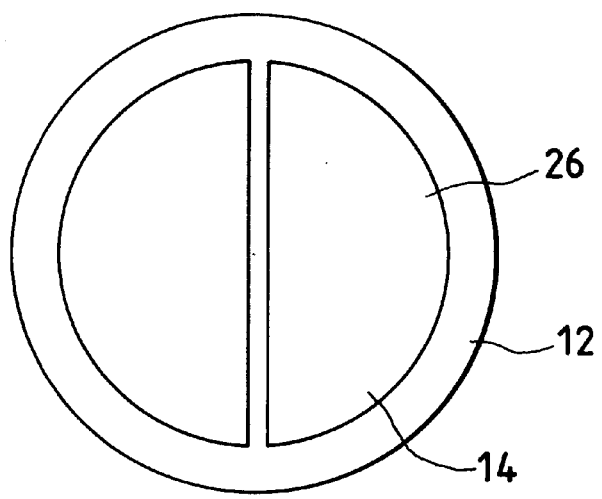
FIG. 3 is a schematic plan view showing a conductor pattern of the bipolar type used in the embodiments of the invention.

An aluminum nitride sheet was provided as a first insulating layer and coated with a conductive printing silver paste by screen printing in a thickness of 10 μm in the form of a bipolar electrode pattern shown in FIG. 3. Thereafter, the paste was baked at a furnace temperature of 800° C. for 3 hours.

The silicone rubber sheet of Compositional Example 2 was provided as a second insulating layer and applied with a silicone adhesive KE 44 (commercially available from Shin-Etsu Chemical Co., Ltd.) in a thickness of 20 μm and bonded with the silver pattern of the aluminum nitride sheet, followed by press bonding under conditions of a pressure of 0.1 kgf/cm$^2$, a temperature of 20° C. and a time of 48 hours.

Subsequently, a silicone adhesive KE44 was applied onto an aluminum substrate by screen printing in a thickness of 10 μm. The thus applied substrate was bonded with the aluminum nitride sheet of the composite sheet composed of the aluminum nitride sheet/silver pattern/silicone rubber sheet of Compositional Example 2, followed by press bonding under conditions of a pressure of 0.1 kgf/cm$^2$, a temperature of 20° C. and a time of 48 hours. Two lead wires were, respectively, attached to the separate portions of the silver electrode pattern by soldering. In order to ensure electric insulation between the lead wires and also between the individual lead wires and the aluminum substrate, Semicoat 114 (commercially available from Shin-Etsu Chemical Co., Ltd.) serving as an epoxy potting agent was applied for sealing as shown in FIG. 2 to obtain an electrostatic chuck of the type shown in FIG. 2.

This chuck was subjected to a cooling performance test in the same manner as in Example 1. As a result, it was found that the wafer temperature was equilibrated at 30° C., revealing that the chuck had a good cooling performance. The results are shown in Table 2.

EXAMPLE 3

A boron nitride sheet was provided as a first insulating layer and coated with a conductive printing tungsten paste by screen printing in a thickness of 15 μm in the form of a bipolar electrode pattern shown in FIG. 3. Thereafter, the paste was baked at a furnace temperature of 800° C. for 3 hours.

The silicone rubber sheet of Compositional Example 3 was provided as a second insulating layer and applied with a silicone adhesive KE 1801 in a thickness of 20 μm and bonded with the tungsten pattern of the boron nitride sheet, followed by press bonding under conditions of a pressure of 0.1 kgf/cm$^2$, a temperature of 120° C. and a time of 10 minutes.

Subsequently, a silicone adhesive KE1801 was applied onto a duralumin substrate by screen printing in a thickness of 10 µm. The thus applied substrate was bonded with the boron nitride sheet of the composite sheet composed of the boron nitride sheet/tungsten pattern/silicone rubber sheet of Compositional Example 3, followed by press bonding under conditions of a pressure of 0.01 kgf/cm$^2$, a temperature of 120° C. and a time of 10 minutes. Two lead wires were, respectively, attached to the separate portions of the tungsten electrode pattern by soldering. In order to ensure electric insulation between the lead wires and also between the individual lead wires and the duralumin substrate, a silicone potting agent KJR632 was applied for sealing as shown in FIG. 2 to obtain an electrostatic chuck of the type shown in FIG. 2.

This chuck was subjected to a cooling performance test in the same manner as in Example 1. As a result, it was found that the wafer temperature was equilibrated at 40° C., revealing that the chuck had a good cooling performance. The results are shown in Table 2.

EXAMPLE 4

A liquid silicone adhesive KE1825 (commercially available from Shin-Etsu Chemical CO., Ltd.) was applied, by screen printing, onto a silicone rubber sheet of Compositional Example 4 as a second insulating layer in a thickness of 20 µm, followed by attaching a 35 µm thick copper foil to the thus applied surface and press bonding under conditions of a pressure of 0.1 kgf/cm$^2$, a temperature of 120° C. and a time of 10 minutes. Thereafter, the foil was chemically etched to form a bipolar electrode pattern as shown in FIG. 3.

A quartz sheet serving as a first insulating layer was coated with a liquid silicone adhesive KE1825 by screen printing in a thickness of 20 µm and superimposed with the copper pattern on the second insulating layer, followed by press bonding under conditions of a pressure of 0.1 kgf/cm$^2$, a temperature of 120° C. and a time of 10 minutes.

Thereafter, a liquid silicone adhesive KE1825 was applied onto a duralumin substrate by screen printing and laminated with the quartz sheet of the composite sheet composed of the quartz sheet/copper pattern/silicone rubber sheet of Compositional Example 4, followed by press bonding under conditions of 0.1 kgf/cm$^2$, a temperature of 120° C. and a time of 10 minutes.

Two lead wires were, respectively, attached to the separate portions of the copper pattern by soldering. In order to ensure electric insulation between the lead wires and also between the individual lead wires and the duralumin substrate, a silicone potting agent KJR632 was applied for sealing as shown in FIG. 2 to obtain an electrostatic chuck of the type shown in FIG. 1.

This chuck was subjected to a cooling performance test in the same manner as in Example 1. As a result, it was found that the wafer temperature was equilibrated at 65° C., revealing that the chuck had a good cooling performance. The results are shown in Table 2.

The chucks made in Examples 1 to 4 were set in a plasma etching apparatus using reaction gases of $CF_4$ and $O_2$ whose partial pressure was 0.1. 4000 silicon wafers were treated under conditions of a temperature of 70° C., a pressure of 0.5 Torr., a microwave input power of 400 W and a treating time of 60 seconds per unit wafer. As a result, it was found that neither any wafer temperature rise nor any variation in the temperature distribution was recognized for every electrostatic chuck. The wafers were anisotropically processed as desired. Thus, it was confirmed that the electrostatic chucks were durable.

COMPARATIVE EXAMPLE 1

For comparison, the general procedure of Example 4 was repeated using such an arrangement as shown in Table 3, thereby obtaining a polyimide electrostatic chuck. This chuck was subjected to a cooling performance test, revealing that the wafer temperature was equilibrated at 120° C. Thus, it was confirmed that the cooling performance was poor.

TABLE 3

|  | Comparative Example 1 | Comparative Example 2 |
|---|---|---|
| Sheet for second insulating layer | polyimide film | alumina |
| Thickness | 25 µm | 500 µm |
| Interfacial adhesive between second insulating film and conductive pattern | epoxy adhesive | nil |
| Thickness | 25 µm |  |
| Conductive pattern | copper foil | silver |
| Thickness | 20 µm | 20 µm |
| Interfacial adhesive between first insulating film and conductive pattern | epoxy adhesive | nil |
| Thickness | 25 µm |  |
| First insulating layer | polyimide film | alumina |
| Thickness | 25 µm | 500 µm |
| Interfacial adhesive between first insulating film and metallic substrate | epoxy adhesive | epoxy adhesive |
| Thickness | 25 µm | 25 µm |
| Metallic substrate | aluminum | aluminum |
| Wafer surface temperature (° C.) | 120 | 110 |

COMPARATIVE EXAMPLE 2

The general procedure of Example 1 was repeated using such an arrangement as shown in Table 3 except that the first and second insulating layers and the conductive pattern were bonded by sintering, thereby obtaining a conductive pattern built-in, integrally sintered alumina electrostatic chuck. This chuck was subjected to a cooling performance test, revealing that the wafer temperature was equilibrated at 110° C. Thus, it was confirmed that the cooling performance was poor.

COMPOSITIONAL EXAMPLES 5 To 8

Preparation of Thermally Conductive Silicone Rubber Compositions

Thermally conductive silicone rubber compositions having such formulations as shown in Table 4 were each prepared. Each composition was pre-formed as a sheet, followed by press molding under conditions of a compression pressure of 5 kgf/cm$^2$, a temperature of 170° C. and a time of 30 minutes to obtain a thermally conductive silicone rubber sheet. The hardness determined by the method described in JIS-A, thermal conductivity, surface roughness and sheet thickness are shown in Table 4. In Table 4, the starting materials A to F, respectively, have the same meanings as in Table 1.

TABLE 4

| | Compositional Example 5 | Compositional Example 6 | Compositional Example 7 | Compositional Example 8 |
|---|---|---|---|---|
| Starting Materials (parts by weight): | | | | |
| A | 100 | 100 | 100 | 100 |
| B | 3 | 3 | 3 | 3 |
| C | 350 | 0 | 0 | 0 |
| D | 0 | 230 | 0 | 0 |
| E | 0 | 0 | 350 | 0 |
| F | 0 | 0 | 0 | 150 |
| Hardness of Cured Product JIS-A (°) | 75 | 65 | 80 | 50 |
| Surface Roughness, Ra, ($\mu$m) | 0.5 | 0.9 | 2.1 | 0.5 |
| Thermal Conductivity (cal/cm · second · ° C.) | 0.0011 | 0.0024 | 0.0050 | 0.0008 |
| Sheet Thickness ($\mu$m) | 250 | 250 | 250 | 250 |

EXAMPLE 5

The sheet of Compositional Example 5 used as a first insulating layer was coated with a liquid silicone adhesive KE1825 by screen printing in a thickness of 25 $\mu$m, on which a 35 $\mu$m thick electrolytic copper foil was attached, followed by press bonding under conditions of a compression pressure of 0.5 kgf/cm$^2$, a temperature of 120° C. and a time of 30 minutes. The thus bonded copper foil was chemically etched in a pattern as shown in FIG. 3.

The sheet of Compositional Example 5 used as a second insulating layer was applied with a liquid silicone adhesive KE 1825 in a thickness of 25 $\mu$m and laminated with the copper pattern of the pattern-bearing first insulating layer, followed by press bonding under conditions of a compression pressure of 0.5 kgf/cm$^2$, a temperature of 120° C. and a time of 30 minutes. Subsequently, a liquid silicone adhesive KE1825 was applied onto an aluminum substrate by screen printing in a thickness of 25 $\mu$m. The aluminum substrate was placed at the thus applied side on the first insulating layer of the composite sheet composed of the first insulating layer/copper electrode pattern/second insulating layer, followed by press bonding under conditions of a compression pressure of 0.5 kgf/cm$^2$, a temperature of 120° C. and a time of 30 minutes.

PTFE-sheathed electric wires were, respectively, bonded to the separate electrode portions of the copper pattern by soldering. Moreover, a silicone sealant KJR632 was applied in position as shown in FIG. 1 or 2 to obtain an electrostatic chuck.

EXAMPLE 6

The sheet of Compositional Example 6 used as a first insulating layer was coated with a liquid silicone adhesive KE1825 by screen printing in a thickness of 25 $\mu$m, on which a 35 $\mu$m thick electrolytic copper foil was attached, followed by press bonding under conditions of a compression pressure of 0.5 kgf/cm$^2$, a temperature of 120° C. and a time of 30 minutes. The thus bonded copper foil was chemically etched in a pattern as shown in FIG. 3.

The sheet of Compositional Example 6 used as a second insulating layer was applied with a liquid silicone adhesive KE 1825 in a thickness of 25 $\mu$m and laminated with the copper pattern of the pattern-bearing first insulating layer, followed by press bonding under conditions of a compression pressure of 0.5 kgf/cm$^2$, a temperature of 120° C. and a time of 30 minutes. Subsequently, a liquid silicone adhesive KE1825 was applied onto an alumite-treated aluminum substrate by screen printing in a thickness of 25 $\mu$m. The substrate was placed at the thus applied side on the first insulating layer of the composite sheet composed of the first insulating layer/copper electrode pattern/second insulating layer, followed by press bonding under conditions of a compression pressure of 0.5 xkgf/cm$^2$, a temperature of 120° C. and a time of 30 minutes.

FEP-sheathed electric wires were, respectively, bonded to the separate electrode portions of the copper pattern by soldering. A silicone sealant KJR632 was applied in position as shown in FIG. 1 or 2 to obtain an electrostatic chuck.

EXAMPLE 7

Primer No. 24 used as an adhesive was applied onto a 35 $\mu$m thick rolled copper foil by a brush and dried in air at room temperature for 30 minutes, followed by lamination of a non-cured sheet of Compositional Example 7 serving as a first insulating layer and press bonding by curing under conditions of a compression pressure of 0.5 kgf/cm$^2$, a temperature of 170° C. and a time of 10 minutes. The copper foil was chemically etched to provide a copper electrode pattern having separate electrodes portions as shown in FIG. 3.

Primer No. 24 serving as an adhesive was applied, by a brush, onto the copper pattern side of the composite sheet composed of the copper pattern/first insulating layer, and dried in air at room temperature for 30 minutes, and laminated with a non-cured sheet of Compositional Example 3 serving as a second insulating layer, followed by press bonding and curing under conditions of a compression pressure of 0.5 kgf/cm$^2$, a temperature of 170° C. and a time of 10 minutes.

Thereafter, a liquid silicone adhesive KE1825 was applied onto a duralumin substrate by screen printing in a thickness of 25 $\mu$m, and the substrate was laminated with the first insulating layer of the composite sheet composed of the first insulating layer/copper electrode pattern/second insulating layer, followed by press bonding under conditions of 0.5 kgf/cm$^2$, a temperature of 120° C. and a time of 10 minutes.

PFA-sheathed electric wires were, respectively, bonded to the separate electrode portions of the copper pattern by soldering. An epoxy sealant, K Semi-coat 114 was applied in position as shown in FIG. 1 or 2 to obtain an electrostatic chuck.

EXAMPLE 8

Primer No. 24 used as an adhesive was applied onto a 50 $\mu$m thick aluminum foil by a brush and dried in air at room temperature for 30 minutes, followed by lamination of a non-cured sheet of Compositional Example 8 serving as a first insulating layer and press bonding and curing under conditions of a compression pressure of 0.5 kgf/cm$^2$, a temperature of 170° C. and a time of 10 minutes. The aluminum foil was chemically etched to provide an aluminum electrode pattern having separate electrodes portions as shown in FIG. 3.

Primer No. 24 serving as an adhesive was applied, by a brush, onto the aluminum pattern side of the composite sheet composed of the aluminum pattern/first insulating layer, and dried in air at room temperature for 30 minutes, and laminated with a non-cured sheet of Compositional Example 4 serving as a second insulating layer, followed by press bonding and curing under conditions of a compression pressure of 0.5 kgf/cm$^2$, a temperature of 170° C. and a time of 10 minutes.

Thereafter, a liquid silicone adhesive KE1825 was applied onto a duralumin substrate by screen printing in a thickness of 25 μm, and the substrate was laminated with the first insulating layer of the composite sheet composed of the first insulating layer/aluminum electrode pattern/second insulating layer, followed by press bonding under conditions of 0.5 kgf/cm², a temperature of 120° C. and a time of 30 minutes.

PFA-sheathed electric wires were, respectively, bonded to the separate electrode portions of the copper pattern by soldering. An epoxy sealant, K Semi-coat 114 was applied in position as shown in FIG. 1 or 2 to obtain an electrostatic chuck.

The electrostatic chucks obtained in Examples 5 to 8 were set in the cooling performance test shown in FIG. 4 to evaluate the cooling performance in the same manner as in Example 1. The results are shown in Table 5, revealing that the equilibrated wafer temperature was 50° C. in Example 5, 40° C. in Example 6, 55° C. in Example 7 and 65° C. in Example 8. Thus, it was confirmed that the chucks of Examples 5 to 8 had the good cooling performance.

The chucks made in Examples 5 to 8 were set in a plasma etching apparatus using reaction gases of $CF_4$ and $O_2$ whose partial pressure was 0.1. 2000 silicon wafers were treated under conditions of a temperature of 70° C., a pressure of 0.8 Torr., a microwave input power of 400 W and a treating time of 60 seconds per unit wafer. As a result, it was found that a resist formed on each wafer was not damaged owing to the rise of a wafer temperature or the variation in the temperature distribution. The wafers were anisotropically processed as desired. Thus, it was confirmed that the electrostatic chucks were durable.

COMPARATIVE EXAMPLES 3 TO 5

For comparison, electrostatic chuck having such arrangements as shown in Table 6 were made, and were subjected to measurement of the wafer temperature in the same manner as in the foregoing examples. The results are shown in Table 6. It should be noted that the electrostatic chuck of Comparative Example 4 is of the integrally sintered type wherein a silver electrode pattern is integrally built in between the first and second insulating layers by sintering of the layers, both made of alumina. The thermally conductive silicone rubber X used in Comparative Example 5 was one wherein 600 parts by weight of alumina were used in the rubber composition of Compositional Example 5. This rubber X had a hardness of 90 after curing, a thermal conductivity of 0.0017 cal/cm·second·° C., and a surface roughness of 6.0 μm.

TABLE 6

|  | Comparative Example 3 | Comparative Example 4 | Comparative Example 5 |
|---|---|---|---|
| Sheet for second insulating layer | polyimide film | alumina | sheet of thermally conductive silicone rubber X |
| Thickness | 25 μm | 500 μm | 25 μm |
| Adhesive layer between second insulating film and conductive pattern | epoxy adhesive | nil | KE 1825 |
| Thickness | 25 μm |  | 25 μm |
| Conductive pattern | copper foil | silver | copper foil |

TABLE 5

|  | Example 5 | Example 6 | Example 7 | Example 8 |
|---|---|---|---|---|
| Second insulating layer | Sheet of Compositional Example 5 | Sheet of Compositional Example 6 | Sheet of Compositional Example 7 | Sheet of Compositional Example 8 |
| Adhesive layer between second insulating layer and conductive pattern | KE 1825 commercially available from Shin-Etsu Chem. Co., Ltd. | KE 1825 | Primer No. 24 commercially available from Shin-Etsu Chem. Co., Ltd. | Primer No. 24 |
| Conductive pattern | electrolytic copper foil | electrolytic copper foil | rolled copper foil | aluminum foil |
| Thickness | 35 μm | 35 μm | 35 μm | 50 μm |
| Adhesive layer between conductive pattern and first insulating layer | KE 1825 | KE 1825 | Primer No. 24 | Primer No. 24 |
| First insulating layer | Sheet of Compositional Example 5 | Sheet of Compositional Example 6 | Sheet of Compositional Example 7 | Sheet of Compositional Example 8 |
| Adhesive layer between first insulating layer and aluminum substrate | KE 1825 | KE 1825 | KE 1825 | KE 1825 |
| Metallic substrate | aluminum | aluminum surface treated with alumite | duralmin | duralmin |
| Lead wire | PTFE-sheatherd wire | FER-sheathed wire | PFA-sheathed wire | FEP-sheathed wire |
| Surface temperature of wafer (° C.) | 50 | 40 | 55 | 65 |

TABLE 6-continued

|  | Comparative Example 3 | Comparative Example 4 | Comparative Example 5 |
|---|---|---|---|
| Thickness Adhesive layer between first insulating film and conductive pattern | 20 µm epoxy adhesive | 20 µm nil | 35 µm KE 1825 |
| Thickness First insulating layer | 25 µm polyimide film | alumina | 25 µm sheet of thermally conductive silicone rubber X |
| Thickness Adhesive layer between first insulating film and metallic substrate | 25 µm epoxy adhesive | 500 µm epoxy adhesive | 200 µm KE 1825 |
| Thickness Metallic substrate | 25 µm aluminum | 25 µm aluminum | 25 µm aluminum |
| Wafer surface temperature (° C.) | 120 | 110 | 100 |

As will be apparent from the above results, the wafer temperature is significantly higher than those temperatures of the examples. Thus, the cooling performance of the chucks of the comparative examples is poor.

What is claimed is:

1. An electrostatic chuck which comprises a metallic plate, a first adhesive layer coated on said metallic plate, a first insulating layer formed on said first adhesive layer and composed of a thermally conductive silicone rubber composition having a thermal conductivity not less than 0.0005 cal/cm·second·° C., said first insulating layer having a thickness of from 50 to 1000 µm, an electrically conductive electrode pattern formed on said first insulating layer and having a thickness of from 1 to 100 µm, a second adhesive layer formed on and surrounding at least a portion of said conductive electrode pattern, and a second insulating layer formed on said second adhesive layer and said conductive pattern and composed of a thermally conductive silicone rubber composition having a hardness of 85° or below as determined by the JIS-A method, a thermal conductivity of not less than 0.0005 cal/cm·second·° C., and a thickness of from 50 to 1000 µm wherein said second insulating layer has a surface roughness of 5 µm or below.

2. An electrostatic chuck as claimed in claim 1, wherein said conductive pattern is positioned adjacent said first insulating layer, and wherein said adhesive layer between said first and second insulating layers adheres said conductive pattern to said second insulating layer.

3. An electrostatic chuck comprising a metallic plate, a first adhesive layer coated on the metallic plate, a first insulating layer formed on said first adhesive layer and composed of a ceramic material selected from the group consisting of aluminum nitride, alumina, boron nitride, silicon nitride and mixtures thereof with a thickness of from 100 to 2000 µm, an electrically conductive electrode pattern formed on said first insulating layer in a thickness of from 1 to 100 µm, a second adhesive layer formed on and surrounding at least a portion of said conductive electrode pattern, and a second insulating layer formed on said second adhesive layer and said conductive pattern and made of a cured product of a silicone rubber composition which comprises a silicone rubber and a filler, said second insulating layer having a thermal conductivity of not less than 0.0005 cal/cm·second·° C., a hardness of 30 to 90° as determined by the JIS-A method, a thickness of from 50 to 1000 µm, a flatness of 50 µm or below, and a surface roughness smaller than 10 µm.

4. An electrostatic chuck as claimed in claim 3, wherein said conductive pattern is positioned adjacent said first insulating layer, and wherein said adhesive layer between said first and second insulating layers adheres said conductive pattern to said second insulating layer.

* * * * *